United States Patent [19]

Kraft

[11] 4,132,573
[45] Jan. 2, 1979

[54] METHOD OF MANUFACTURING A MONOLITHIC INTEGRATED CIRCUIT UTILIZING EPITAXIAL DEPOSITION AND SIMULTANEOUS OUTDIFFUSION

[75] Inventor: Wolfgang Kraft, Freiburg, Germany

[73] Assignee: Murata Manufacturing Co., Ltd., Kyoto, Japan

[21] Appl. No.: 874,592

[22] Filed: Feb. 2, 1978

Related U.S. Application Data

[63] Continuation-in-part of Ser. No. 766,652, Feb. 8, 1977, abandoned.

[51] Int. Cl.² .................. H01L 21/20; H01L 21/225; H01L 21/74
[52] U.S. Cl. .................................. 148/175; 29/576 E; 29/576 W; 29/578; 148/187; 148/190; 148/191; 357/44; 357/46; 357/48; 357/89; 357/90; 357/92
[58] Field of Search ............... 148/175, 187, 190, 191; 29/576 W, 576 E, 577, 578; 357/44, 46, 48, 89, 90, 92

[56] References Cited

U.S. PATENT DOCUMENTS

| | | | |
|---|---|---|---|
| 3,423,650 | 1/1969 | Cohen | 148/187 X |
| 3,481,801 | 12/1969 | Hugle | 148/175 |
| 3,723,199 | 3/1973 | Vora | 148/175 |
| 3,767,486 | 10/1973 | Imaizumi | 148/175 |
| 3,909,807 | 9/1975 | Fulton | 357/48 X |
| 3,922,565 | 11/1975 | Berger et al. | 357/44 X |
| 3,928,091 | 12/1975 | Tachi et al. | 148/191 X |
| 4,032,372 | 6/1977 | Vora | 148/175 |

FOREIGN PATENT DOCUMENTS

1231543 5/1971 United Kingdom .................. 148/175

OTHER PUBLICATIONS

Hilbiber, D., "High-Performance ----Integrated Circuits" IEEE Trans. on Electron Devices, v. Ed-14, No. 7, Jul. 1967, pp. 381-385.
Czorny, B., "Epitaxy-Versatile Technology for Integrated Circuits", R.C.A. Engineer, vol. 13, No. 3, Oct.-Nov. 1971, pp. 28-32.
Berger et al., "Base Ring Transistor and Method of Production", I.B.M. Tech. Discl. Bull., vol. 14, No. 1, Jun. 1971, p. 302.
Frantz et al., "Monolithic Electric Circuit", IBID., vol. 14, No. 6, Nov. 1971, p. 1684.

Primary Examiner—L. Dewayne Rutledge
Assistant Examiner—W. G. Saba
Attorney, Agent, or Firm—Birch, Stewart, Kolasch and Birch

[57] ABSTRACT

A monolithic integrated circuit is formed having semiconductor components disposed in surface regions of a semiconductor body, said regions being electrically isolated from the remaining semiconductor body by a pn-junction plane. The regions into which the semiconductor components are formed are electrically isolated by heavily doping surface areas of a substrate with phosphorus, antimony and/or arsenic impurities which are of the opposite conductivity from the substrate. After said doping, an epitaxial layer having a conductivity opposite to that of the substrate is formed over the entire substrate surface with a doping concentration lower than that of the substrate so that during subsequent high temperature processing steps, the substrate impurity out-diffuses into the epitaxial layer and the phosphorus of the heavily doped surface areas diffuses downwardly into the substrate to form a step-like pn-junction surface alternately extending into the substrate and into the epitaxial layer. During subsequent processing operations, an impurity of the same conductivity type as used in the substrate is diffused downwardly from the surface of the epitaxial layer to meet the out-diffused substrate impurity to complete the isolation of surface regions of the semiconductor body into which the semiconductor components are formed.

4 Claims, 6 Drawing Figures

METHOD OF MANUFACTURING A MONOLITHIC INTEGRATED CIRCUIT UTILIZING EPITAXIAL DEPOSITION AND SIMULTANEOUS OUTDIFFUSION

CROSS-REFERENCE TO RELATED APPLICATIONS

This application is a continuation-in-part of U.S. application Ser. No. 766,652 filed Feb. 8, 1977 now abandoned.

BACKGROUND OF THE INVENTION

1. Field of the Invention

This invention relates to a method of manufacturing a monolithic integrated circuit and, more particularly, to such a circuit wherein components are formed in surface regions of a semiconductor body, which regions are electrically isolated from the remaining semiconductor body by a stepped pn-junction surface.

2. Description of the Prior Art

It is well known to produce an isolated surface region by diffusion of a frame-shaped insulating zone of a first conductivity type, through an epitaxially grown layer of a second conductivity type on a substrate of the first conductivity type. This method of isolation requires a special planar diffusion process and the associated photolithographic etching steps.

The disadvantages of the above method are avoided by a method disclosed in the German Pat. No. 1,769,271. Said German patent teaches a method wherein a highly doped surface region of opposite conductivity is diffused into a substrate prior to the formation of an epitaxially grown layer over the substrate. The epitaxial layer is of the same conductivity type as the highly doped region but has a lower doping concentration than the doping concentration of the substrate and has a controlled thickness. The thickness is controlled so that during a subsequent diffusion of an insulating zone into the epitaxial layer around the highly doped region and during the diffusion of elements of semiconductor components into the surface of the epitaxial layer above the region, the insulating zone impurities will diffuse inwardly to meet impurities diffusing outwardly from the semiconductor substrate to completely isolate a surface region of the semiconductor body with a pn-junction surface formed between the substrate type impurities and the epitaxial layer type impurities. In particular, during diffusion of the base of a planar transistor component into the region the isolating junction is completed.

In the case of monolithically integrated circuits employing a particularly low-ohmic substrate, the aforementioned method has the disadvantage that the breakdown voltage of the pn-junction between the surface region and the substrate rapidly decreases as the impurity concentration of the substrate increases. This breakdown voltage also decreases as the grown epitaxial layer becomes thinner, because the steepness of such a pn-junction increases as the Dt-product (D = diffusion constant of the dopings, t = time) decreases. A subsequent diffusion of the impurities would provide an improvement, but this causes a diminution of the sheet conductivity by diffusion of compensating impurities into the buried layer.

SUMMARY OF THE INVENTION

The method according to the invention is particularly suitable in connection with the manufacture of a monolithically integrated I$^2$L circuit comprising at least one bipolar analog circuit part as has become known from the technical journal "Valvo-Berichte", Vol. XVIII, No. ½ (Apr. 1974), pp. 215 to 216. Such an integrated circuit requires a thin epitaxial layer in order to obtain as high as possible α-values in the I$^2$L circuit part which has collectors at the semiconductor surface, and because in view of the relatively small efficiency of the emitter zone and the relatively high surface recombination, the volume recombination is reduced to a minimum value. This is the reason why epitaxial layers are used having a thickness of preferably less than approximately 10 microns (μm).

Accordingly, it is an object of the invention to increase the breakdown voltage of the pn-junction between the buried layer of the same conductivity type as the surface region, and the substrate, without causing any substantial diminution of the sheet conductivity of the buried layer.

According to a broad aspect of the invention, there is provided a method of manufacturing a semiconductor device having a region lying at the surface of a semiconductor body, which surface region is electrically isolated from the remaining semiconductor body by a pn-junction surface and contains at least one semiconductor component of a monolithic integrated circuit. The surface region is formed by diffusing into said substrate a highly doped area having a conductivity opposite to that of said substrate. The area is doped with two different impurities having substantially different diffusion rates. An epitaxial layer is then grown on the surface of said substrate including said highly doped area. The epitaxial layer has the same conductivity as that of said highly doped area and an impurity concentration lower than that of said substrate. The epitaxial layer has a controlled thickness such that during a subsequent diffusion of an insulating zone around said highly doped area and during the diffusion of an element of said semiconductor component, such as the base, the insulating zone impurities diffuse inwardly to meet with substrate impurities that diffuse outwardly to complete a pn-junction surface that isolates the surface region.

The impurity of the highly doped area that has the faster diffusion rate diffuses inwardly into the substrate to form the pn-junction with the substrate impurity, and the impurity of the highly doped area that has the slower diffusion rate diffuses both into the substrate and the epitaxial layer to form a highly doped buried layer.

The element of the semiconductor component could also be an element of a pn-diode as well as the base of a planar transistor component of the monolithically integrated circuit.

The method according to the invention is to be carried out in such a way that the insulating zone and substrate impurities will diffuse together to complete the isolating pn-junction at the latest after the completion of the temperature treatments necessary for growing the epitaxial layer and for performing all of the necessary planar diffusion processes to complete the semiconductor component.

As to the prior art it is still to be mentioned that from the German Offenlegungsschrift (DT-OS) 1 639 177, it was known to perform a doping with phosphorus on a highly doped buried layer or a part of the buried layer at the interface between the substrate and one epitaxial layer of a monolithically integrated circuit. This doping serves to produce a drift field aimed at making it more difficult for minority charge carriers to reach the space charge zone of the pn-junction between the buried layer and the substrate. By dividing the buried layer into two partial layers of which the one layer juxtaposed with the epitaxial layer, is doped with phosphorus, there is not provided a solution to the aforementioned problem, the solution of which the present invention is based.

DESCRIPTION OF THE PREFERRED EMBODIMENT

Figure 1:
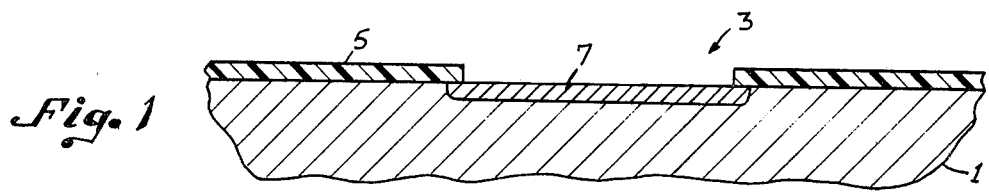
FIGS. 1 to 6 illustrate successive steps of the method according to the invention and are sectional views taken vertically with respect to the surface of a semiconductor body

As shown in FIG. 1 and according to the method described in the aforementioned German Pat. No. 1,769,271, there is first formed a surface area 7 by pre-deposition of phosphorus upon a semiconductor substrate 1, which pre-deposition is accomplished through a window 3 formed in an oxide layer 5. The semiconductor substrate 1 is preferably formed of silicon including P-type impurities such as boron doped at a concentration of approximately $10^{17}$ atoms per cubic centimeter with a nominal resistivity of 0.2 ohm centimeters. The oxide layer 5 is formed in the known manner and the window 3 is opened using standard photo-etching techniques. The phosphorus deposition is continued for a period of approximately ten minutes at 850° C. in a slightly oxidizing atmosphere of $N_2 + O_2$ containing $POCl_3$ or $PH_3$. The pre-deposition step is followed by a diffusion process of approximately one hour duration at 1200° C. in a slightly oxidizing atmosphere to achieve a diffusion depth of approximately 2.5 to 3 microns with a sheet resistance of approximately 70 ohms per square.

Figure 2:
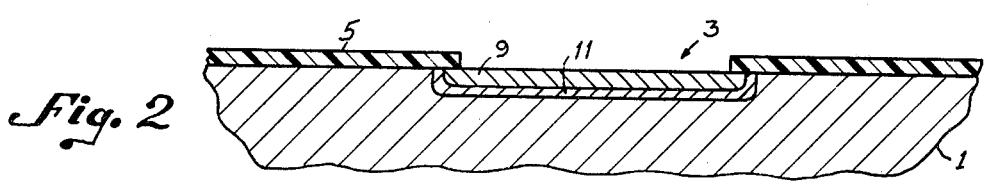

During the diffusion process, a layer of oxide forms over the surface of the semiconductor substrate and therefore window 3 must be reopened prior to subjecting the substrate to a deposition of antimony and/or arsenic impurities using a standard planar diffusion process for a period of approximately one hour at a temperature of 1240° C. to establish a surface region 9 of highly doped impurity having a sheet resistance of approximately 25 to 45 ohms per square. Referring to FIG. 2, there is shown how the surface area 9 of highly doped antimony and/or arsenic impurities is formed with a deeper impurity region 11 of phosphorus atoms extending inwardly from the surface area 9.

The concentration of the phosphorous atoms must be smaller than that of the antimony and/or arsenic atoms in order to prevent the phosphorus atoms from diffusing in an excessively strong manner into an epitaxial layer which is to be formed subsequently. The phosphorous atoms, however, diffuse inwardly to form region 11 below the surface region 9 and form a pn-junction with the P-type impurity of the semiconductor substrate 1. The antimony and/or arsenic atoms which have a slower diffusion rate than the phosphorus remain near the surface to form a highly doped surface region.

Additional highly doped areas may be formed simultaneously to achieve additional electrically isolated regions into which additional analog circuit parts of the monolithic circuit may be formed.

Figure 3:
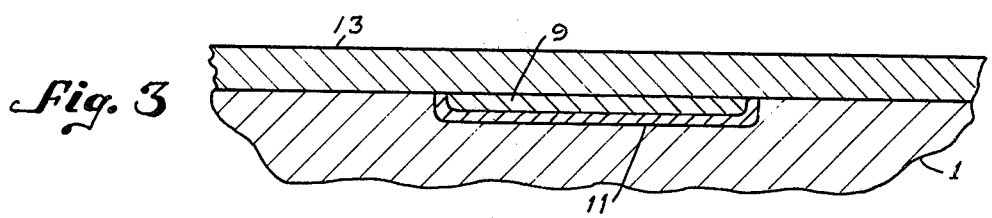

Referring to FIG. 3, there is shown an epitaxial layer 13 deposited over the surface of the semiconductor substrate 1, said epitaxial layer being formed using conventional processes to a thickness of approximately 5 microns. The impurity concentration of the epitaxial layer 13 is maintained at a level lower than that of the substrate 1 so that during a subsequent thermal oxidation process that lasts for a period of approximately one hour at 1200° C., the P-type impurity of the substrate diffuses outwardly into the epitaxial layer 13 to a depth of up to approximately 3 microns to form a pn-junction surface 15 as shown in FIG. 4.

Figure 4:
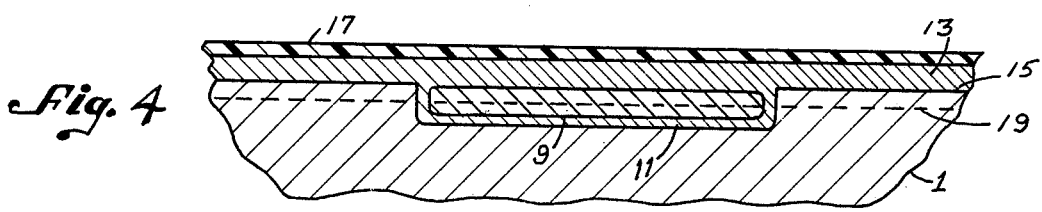

Referring to FIG. 4, there is shown an oxide layer 17 formed during the thermal oxidation process and the pn-junction surface 15 extending into the epitaxial layer 13 to convert the region of the epitaxial layer 13 shown above a dotted line 19 and below the junction plane 15 to a P-type semiconductivity. It is to be noted that the surface region 9 during the thermal oxidation process also diffuses outwardly into the epitaxial layer 13 to form a highly doped buried layer 9 which has a higher impurity concentration than the region formed by the inwardly diffused phosphorus atoms in region 11.

Figure 5:
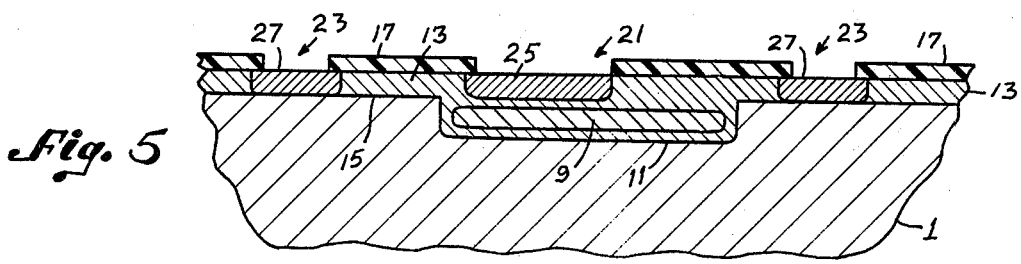

Referring to FIG. 5, there is shown how the oxide layer 17 has formed therein a component window 21 disposed above the buried layer 9 and an isolation window 23 which extends about the entire periphery of the component window 21 and the buried layer 9. The device is then subjected to a planar diffusion process, during which there is a pre-deposition step in a nitrogen environment, which step lasts for approximately 20 minutes to expose the open windows to a boron nitride source. After the pre-deposition step, the device is subject to a diffusion step for a period of approximately 35 minutes at a temperature of 1200° C. in a wet environment so that P-type boron impurities are driven to a depth of approximately 2.2 microns and forms a sheet resistivity of 200 ohms per square. This diffusion step forms a base region 25 and an isolating zone 27 with the isolating zone 27 being diffused to a depth sufficient to contact the P-type impurities that diffuse outwardly from the semiconductor substrate 1 so that the pn-junction 15 thereafter extends to the oxide layer 17 and totally isolates regions of the epitaxial layer 13 which have N-type impurity concentrations.

Figure 6:
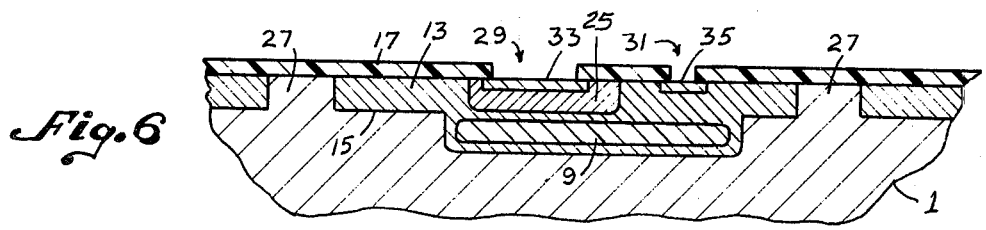

Referring to FIG. 6, an oxide layer 17 is again formed over the surface of the semiconductor device, and a collector window 31 and an emitter window 29 or an emitter window 31 and a collector window 29 in the case of $J^2L$ layout are etched therein, said window 29 being disposed over the base region 25. Utilizing a standard planar diffusion process, in the case of $J^2L$ layout, a collector region 33 is formed in the base region 25 and an emitter contact region 35 is, in like manner, formed in the isolated regions of layer 13. Thus, there is provided an isolated region of the epitaxial layer 13 having N-type impurities separated from the semiconductor substrate 1 having P-type impurities by a pn-junction 15. The isolated region 13 has formed therein a buried layer 9 of highly doped N-type impurities with an active semiconductor device formed thereabove.

Thus, the step-like pn-isolating junction 15 is completed by the inward diffusion of P-type impurities through region 27 and the outward diffusion of the P-type impurities from the semiconductor substrate 1, which impurities meet to totally isolate regions of the epitaxial layer 13, into which there is formed components of a monolithic integrated circuit. The thickness of the epitaxial layer 13 must be related to the concentration ratio of the doping concentration of the epitaxial layer 13 and the substrate 1 so that during the high temperature processes, the P-type impurities will diffuse upwardly from the substrate 1 and downwardly from the isolation regions 27 to combine and totally isolate regions of the epitaxial layer 13.

It is to be understood that the described embodiment has been illustrated as an example of the present invention and that the P and N type impurities could be alternated and that other types of impurities known to those skilled in the art could be substituted for those described in the specification.

What is claimed is:

1. A method of forming an isolated region of semiconductive material having a first type impurity in a semiconductor body of a second type of impurity, said isolated region including a highly doped buried layer of first type impurity, comprising the steps of:

diffusing a surface area of a semiconductor substrate of second type impurity with an impurity of the first type and having a first diffusion rate;

diffusing said area of the semiconductor substrate with a second impurity of the first type and having a second diffusion rate slower than the first diffusion rate;

forming an epitaxial layer over the entire surface of the semiconductor substrate, said epitaxial layer having a first type of impurity with a concentration less than that of the substrate; and diffusing into the surface of the epitaxial layer a second type impurity into an isolating zone surrounding the region and continuing said diffusion until the impurity of the substrate outdiffuses through the epitaxial layer to meet the impurity of the isolating zone which diffuses inwardly, so that the region of first type impurity is entirely surrounded by a continuous region of second type impurity and the impurity having the first diffusion rate diffused inwardly into the substrate so that a continuous pn-junction surface is formed about the region and the impurity having the second diffusion rate forms the buried layer.

2. A method according to claim 1, wherein an element of a semiconductor component is diffused into the surface of the epitaxial layer simultaneously with the diffusion of the isolating zone.

3. A method according to claim 2, wherein additional elements of a semiconductor component are diffused into the surface of the epitaxial layer, during which diffusion steps the outwardly diffused impurities of the substrate meet the inwardly diffused impurities of the isolation zone.

4. A method as described in claim 1, additionally comprising the step of forming a semiconductor component in the surface of the epitaxial layer above the highly doped area, while simultaneously diffusing the impurities of the isolating zone inwardly and the impurities of the substrate outwardly.

* * * * *

UNITED STATES PATENT AND TRADEMARK OFFICE
CERTIFICATE OF CORRECTION

PATENT NO. : 4,132,573
DATED : January 2, 1979
INVENTOR(S) : Wolfgang Kraft

It is certified that error appears in the above–identified patent and that said Letters Patent are hereby corrected as shown below:

[73]   Assignee:   ITT Industries, Inc.
                   New York, New York

[56]   Attorney, Agent, or Firm - John T. O'Halloran;
                                  Peter C. Van Der Sluys Signed and Sealed this Twenty-fifth Day of September 1979

[SEAL]

Attest:

Attesting Officer

LUTRELLE F. PARKER
*Acting Commissioner of Patents and Trademarks*